United States Patent
Lin et al.

(10) Patent No.: US 9,818,694 B2
(45) Date of Patent: Nov. 14, 2017

(54) ACTIVE ATOMIC RESERVOIR FOR ENHANCING ELECTROMIGRATION RELIABILITY IN INTEGRATED CIRCUITS

(71) Applicant: Taiwan Semiconductor Manufacturing Company, Ltd., Hsin-Chu (TW)

(72) Inventors: Ming-Hsien Lin, Hsinchu County (TW); Anthony Oates, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/941,770

(22) Filed: Nov. 16, 2015

(65) Prior Publication Data
US 2017/0141033 A1  May 18, 2017

(51) Int. Cl.
H01L 23/00 (2006.01)
H01L 23/528 (2006.01)
H01L 23/522 (2006.01)
H01L 23/58 (2006.01)
H01L 27/02 (2006.01)

(52) U.S. Cl.
CPC ...... *H01L 23/5286* (2013.01); *H01L 23/5226* (2013.01); *H01L 23/58* (2013.01); *H01L 27/0203* (2013.01)

(58) Field of Classification Search
CPC .................................................. H01L 23/5286
See application file for complete search history.

(56) References Cited

U.S. PATENT DOCUMENTS

| | | | |
|---|---|---|---|
| 4,827,327 A | 5/1989 | Miyauchi et al. |
| 5,293,069 A | 3/1994 | Kato et al. |
| 5,696,030 A | 12/1997 | Cronin |
| 5,770,519 A | 6/1998 | Klein et al. |
| 5,963,831 A | 10/1999 | Fu |
| 6,072,945 A | 6/2000 | Aji et al. |

(Continued)

FOREIGN PATENT DOCUMENTS

| WO | WO 99/35691 | 7/1999 |
| WO | WO 2012053130 | 4/2012 |

OTHER PUBLICATIONS

Oates et al., "Electromigration Failure of Circuit—Like Interconnects: Short Length Failure Time Distributions with Active Sinks and Reservoirs," Reliability Physics Symposium, 2014 IEEE International, Jun. 2014, Waikoloa, HI, pp. 5A.2.1-5A.2.7.

(Continued)

*Primary Examiner* — William Harriston
(74) *Attorney, Agent, or Firm* — Haynes and Boone, LLP

(57) ABSTRACT

An integrated circuit (IC) comprises a first conductor in one layer of the IC, a second conductor in another layer of the IC, and a first metal plug connecting the first and second conductors. The IC further comprises an atomic source conductor (ASC) in the one layer of the IC and joined to the first conductor, and a second metal plug connecting the ASC to a voltage source of the IC. The first conductor and the ASC are configured to be biased to different voltages so as to establish an electron path from the second metal plug to the first metal plug such that the ASC acts as an active atomic source for the first conductor.

20 Claims, 11 Drawing Sheets

(56) References Cited

U.S. PATENT DOCUMENTS

| | | |
|---|---|---|
| 6,717,268 B2 | 4/2004 | Hau-Riege |
| 7,301,236 B2 | 11/2007 | Greco et al. |
| 2007/0284724 A1 | 12/2007 | Englekirk |
| 2013/0140711 A1 | 6/2013 | Iwasaki et al. |
| 2013/0154128 A1* | 6/2013 | Wang .................. H01L 23/5286 |
| | | 257/786 |

OTHER PUBLICATIONS

Lin et al., "An Electromigration Failure Distribution Model for Short-Length Conductors Incorporating Passive Sinks/Reservoirs," 2012 IEEE Transactions on Device and Materials Reliability (vol. 13, Issue 1), 5 pages.

* cited by examiner

US 9,818,694 B2

ACTIVE ATOMIC RESERVOIR FOR ENHANCING ELECTROMIGRATION RELIABILITY IN INTEGRATED CIRCUITS

BACKGROUND

Semiconductor integrated circuits (ICs) use metallic interconnects to connect individual devices on a chip. A major challenge to the continued scaling of IC technologies is the electromigration failure of the metallic interconnects. Electromigration refers to the phenomenon of electric current induced metal self-diffusion. Stated briefly, electromigration is the transport of material in a conductor arising from the momentum exchange between the electron currents (the "electron wind" force). Electromigration induced material depletion will lead to the development of tensile stress, while accumulation leads to the development of compressive stress at blocking boundaries. A backflow flux originates from the stress gradient and counters the electromigration flux. If the stress exceeds a critical value required for void nucleation, the line will fail. It is important to assess IC metallization reliability because of the high current densities that circuit interconnects carry. For example, thin film IC interconnects carry relatively high current densities in the range of $10^5$ to $10^6$ A/cm2, which leads to a large flux of atoms in the direction of electron flow. Therefore, there is a need to design and/or manufacture ICs that can withstand the electromigration impact for the target product lifetime at the target current density.

In one approach, dummy vias (or via plugs) are added to a conductor. A dummy via is non-functional—it does not form part of a signal line. A dummy via is also passive—it is not biased to any voltage. A dummy via is connected to the conductor at one end, and is left floating at the other end. The dummy via becomes a passive atomic reservoir for the conductor. Such approach generally has minor impact on electromigration because the top surface of the conductor is not the dominant electromigration diffusion path. Studies have shown that vias are places of atomic flux divergence, making them a primary electromigration reliability concern. In another approach, dummy lines are added to a conductor by extending the width of the conductor at various places. Such dummy lines become passive atomic reservoir for the conductor. Such approach has its own drawback. When the conductor's current changes direction, a previous passive atomic reservoir may become a passive atomic sink, which worsens the lifetime of electromigration. Accordingly, improvements in these areas are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
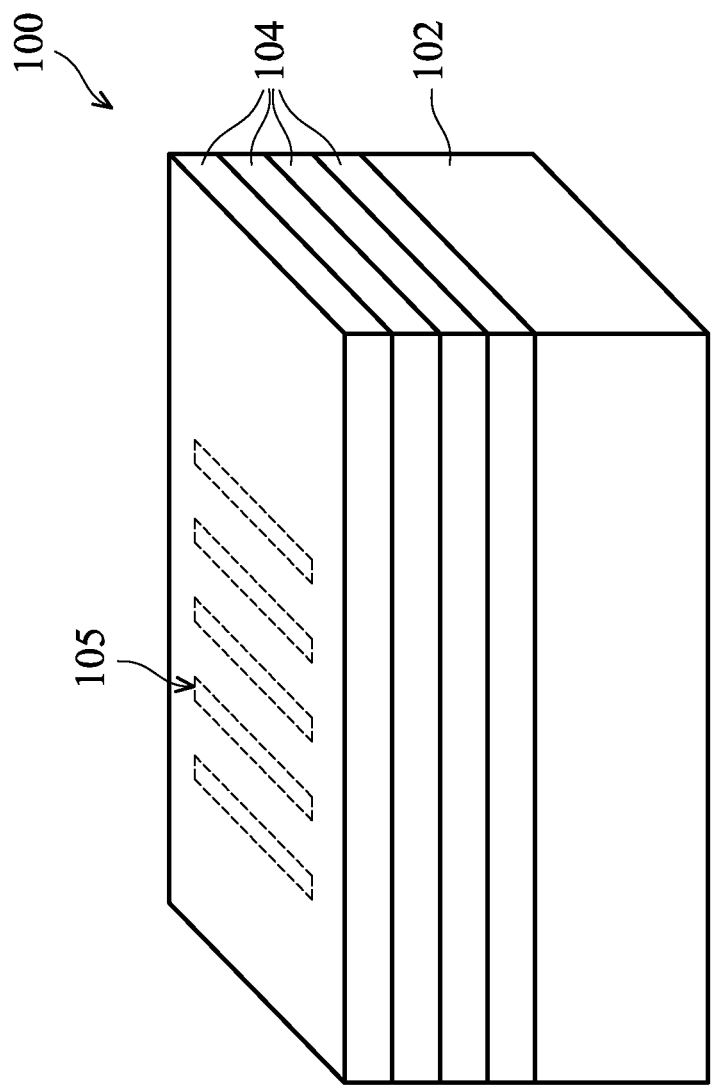
FIG. 1 is a perspective view of an integrated circuit (IC).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, it is related to multilayer interconnects for integrated circuits (IC). An object of the present disclosure is to provide active atomic reservoirs for improving IC interconnects' reliability in view of electromigration. The active atomic reservoirs include conductors that are biased to certain voltages of the IC but do not form part of a signal line of the IC. Rather, they act as atomic sources for other conductors to which they are joined. The other conductors may be power rails and/or signal lines of the IC that are susceptible to electromigration. For example, they may carry high current density when the IC is in operation. In the following discussion, the conductors of the active atomic reservoirs are referred to as atomic source conductors (ASCs), while the conductors to which the ASCs are joined are referred to as the target conductors. The target conductors may comprise power rails and signal lines. In one aspect, the ASCs are short conductors carrying relatively small current density. The ASCs and the target conductors are biased to different voltages such that electrons always flow from the ASCs to the respective target conductors. This effectively makes the ASCs an active supply of the metallic ions, boosting the electromigration lifetime of the target conductors. Many aspects of the active atomic reservoirs of the present disclosure will be discussed below through a description of embodiments that involve multilayer interconnects in an IC.

FIG. 1 shows a perspective view of an IC 100 constructed according to various aspects of the present disclosure. Referring to FIG. 1, the IC 100 includes a substrate 102 and wiring layers 104 formed over the substrate 102. The wiring layers 104 contain conductive lines (indicated by the phantom lines) and vias (not shown). The various conductive lines and vias form an interconnect structure 105 that connect active (e.g., transistors) and/or passive (e.g., resistors) devices in the substrate 102. It is noted that, in various embodiments, the IC 100 may include any number of wiring layers 104, such as four, five, six, seven, or even more wiring layers.

In embodiments, the substrate 102 includes a silicon substrate (e.g., a wafer). Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). The substrate 102 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 102 may further include passive devices such as resistors, capacitors, and inductors.

The wiring layers 104 include dielectric materials in which the conductive lines and vias of the interconnect structure 105 are embedded. In embodiments, the dielectric materials may include a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In embodiments, the conductive lines may each include an electrically conductive metal-diffusion barrier layer as an outer layer and a metal conductor as an inner layer. For example, the metal-diffusion barrier layer may comprise tantalum (Ta) or tantalum nitride (TaN), and the metal conductor may comprise copper (Cu), aluminum (Al), tungsten (W), cobalt (Co), silver (Ag), gold (Au), and other suitable metals. Similarly, the vias may each include a metal-diffusion barrier layer as an outer layer and a metal plug as an inner layer.

Figure 2:
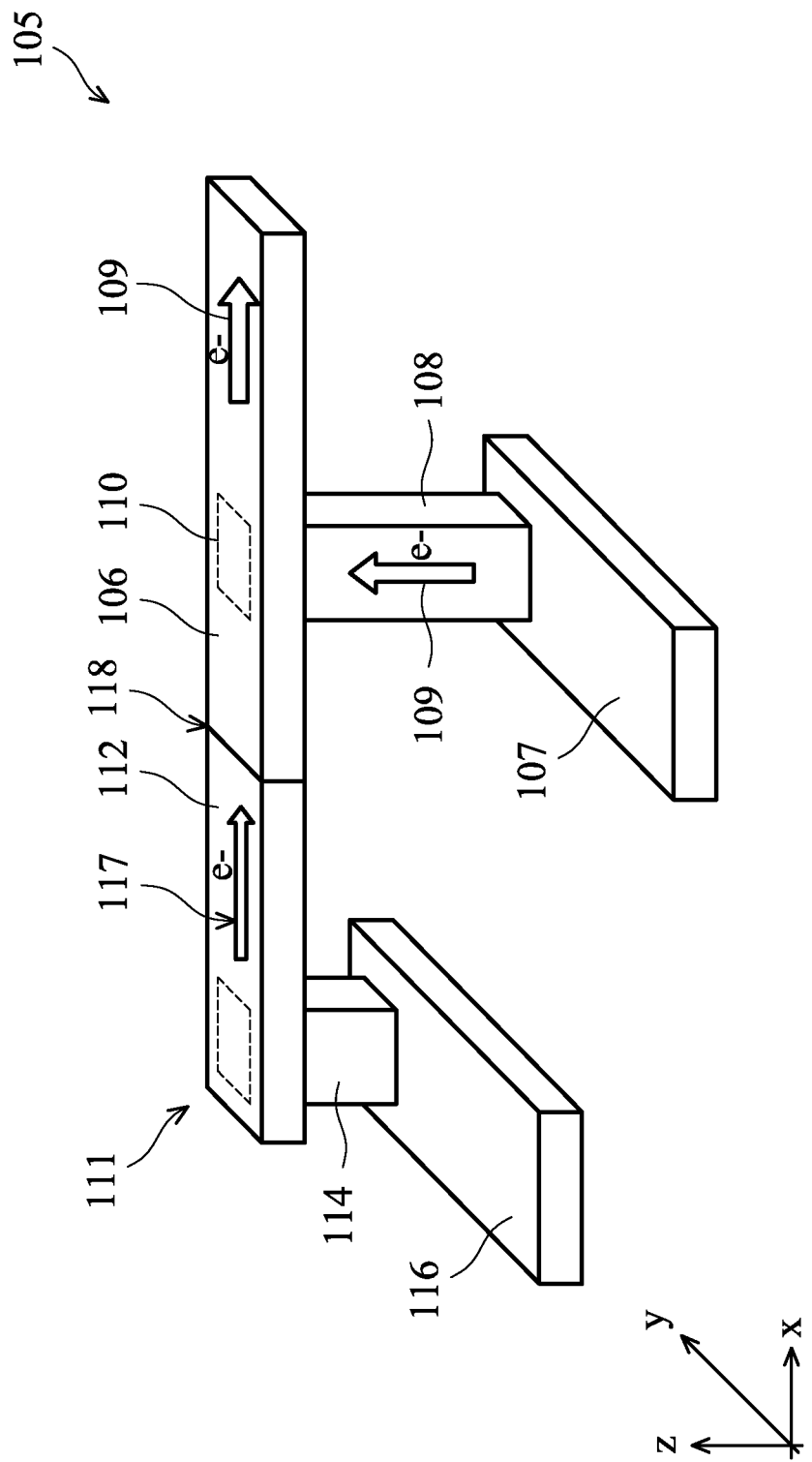
FIG. 2 is a perspective view of a portion of an interconnect structure of the IC of FIG. 1, constructed according to various aspects of the present disclosure.

FIG. 2 shows an example of a portion of the interconnect structure 105, constructed according to various aspects of the present disclosure. Referring to FIG. 2, the interconnect structure 105 includes a first conductor 106 in one wiring layer 104 (FIG. 1) and a second conductor 107 in another wiring layer 104 (FIG. 1). The interconnect structure 105 further includes a metal plug 108 (a part of a via) connecting the first and second conductors, 106 and 107. In embodiments, the first conductor 106, the second conductor 107, and the metal plug 108 may each comprise copper (Cu), aluminum (Al), tungsten (W), cobalt (Co), silver (Ag), gold (Au), or other suitable metals. The metal features 106, 107, and 108 may each be surrounded (or covered) by a metal-diffusion barrier layer. The metal-diffusion barrier layer prevents the metal material of the features 106, 107, and 108 from diffusing into the dielectric material layers of the wiring layers 104. The metal-diffusion barrier layer may be a refractory metal that does not suffer electromigration. For the purposes of simplicity, the metal-diffusion barrier layers and the dielectric material layers are not shown.

In an embodiment, the first conductor 106, the second conductor 107, and the metal plug 108 are disposed in adjacent wiring layers 104. For example, the second conductor 107 is disposed in the first metal layer (M1), the metal plug 108 is disposed in the first via layer (Via1) over the M1 layer, and the first conductor 106 is disposed in the second metal layer (M2) over the Via1 layer. In one particular example, the metal plug 108 and the first conductor 106 may be formed in one wiring layer 104 using a dual damascene process. In various embodiments, the first conductor 106 may be disposed in any of the wiring layers 104, such as in M0, M1, M2, . . . Mn metal layers. The second conductor 107 may be disposed in any of the wiring layers 104 different from the wiring layer where the first conductor 106 is disposed. Further, the first conductor 106 may be disposed over or under the second conductor 107 in various embodiments.

FIG. 2 further illustrates an electron path 109 that goes through the metal plug 108, along the first conductor 106, and towards the right side of the page (the sink of the electrons are not shown). When the IC 100 is in operation, electrons flow along the path 109. It is noted that current flows in the opposite direction of the electrons. For the convenience of discussion, the direction of the electron flow is used in the present disclosure. The electrons may drag metallic ions from the metal features 106, 107, and 108 along with them. Studies have shown that the areas of the conductor/via where the electron path changes directions are most susceptible to electromigration. One such area 110 is illustrated in FIG. 2 with the dotted lines on the first conductor 106 above the metal plug 108. If the issue of electromigration is not dealt with properly, metallic ions may deplete in or near the area 110 over time to cause "open circuit" failures. The present disclosure provides an active atomic reservoir 111 to help alleviate the impacts of electromigration. FIG. 2 illustrates an embodiment of the active atomic reservoir 111.

Still referring to FIG. 2, in the present embodiment, the active atomic reservoir 111 includes a conductor 112 which is an atomic source conductor (ASC) and a metal plug 114 that connects the ASC 112 to a power rail 116. The ASC 112 is disposed in the same wiring layer 104 as the first conductor 106. The power rail 116 is a voltage source of the IC 100. In an embodiment, the ASC 112 and the metal plug 114 comprise essentially the same material as the first conductor 106 and the metal plug 108, respectively. The ASC 112 and the metal plug 114 may each be surrounded by a metal-diffusion barrier layer (not shown). The power rail 116 and the second conductor 107 may be disposed in the same wiring layer 104 or in different wiring layers. FIG. 2 further illustrates an electron path 117 where electrons flow from the ASC 112 to the first conductor 106. In the present embodiment, the voltage source for the ASC 112 and the voltage source for the first conductor 106 are configured such that the electron path 117 keeps the same direction in all operational modes of the IC 100. In an embodiment, the current density, $j_{asc}$, along the electron path 117 is equal to or smaller than the current density, $j_c$, along the electron path 109 ($j_{asc} \leq j_c$). In various embodiments, the ratio of ($j_{asc}/j_c$) may be tuned based on design needs. When the ratio increases (decreases), the electromigration lifetime of the first conductor 106 increases (decreases), but the active atomic reservoir 111's electromigration lifetime decreases (increases). Further, the length of the ASC 112 may be smaller than the length of the first conductor 106. In an embodiment, the length of the ASC 112 is in a range of 0.02 microns (μm) to 2 μm. The ASC 112 joins the first conductor 106 at an interface 118. In an embodiment, the first conductor 106 and the ASC 112 are formed by the same process and with the same material. In such a case, the interface 118 is only an imaginary boundary, and not a distinguishable interface. In the present embodiment, the ASC 112 has the same width as the first conductor 106. It joins the first conductor 106 at one end of the first conductor 106, and extends along a longitudinal axis of the first conductor 106.

When the IC 100 is in operation, electrons flow along the path 109 according to the operational modes of the IC 100. Metallic ions of the first conductor 106 are dragged along by the electrons and may deplete, e.g., in the area 110. At the same time, metallic ions of the ASC 112 move along the path 117 and inject into the first conductor 106 to replenish the lost metallic ions. This may be effectuated by two forces. First, electrons moving along the path 117 carry with them some metallic ions. Second, as metallic ions in the area 110 deplete, a concentration gradient forms along the path 117. The combined forces make the active atomic reservoir 111 more effective than a dummy atomic reservoir that is not biased to any voltage source (in another word, floating). Further, with a dummy atomic reservoir, if the electron path 109 reverses its direction (e.g., due to reconfiguration of the IC 100), the dummy atomic reservoir might become a passive atomic sink, which would worsen the effects of electromigration on the first conductor 106. In the present disclosure, the active atomic reservoir 111 keeps the direction of the electron path 117 the same under all operations of the IC 100. Therefore, the active atomic reservoir 111 does not become an atomic sink. This may be realized by properly configuring the respective voltage sources for the ASC 112 and the first conductor 106.

In an embodiment, the active atomic reservoir 111 is formed in the same process that forms other parts of the interconnect structure 105. For example, the power rail 116 and the second conductor 107 may be formed by the same process and in the same wiring layer 104, the metal plugs 114 and 108 may be formed by the same process and in the same wiring layer 104, and the ASC 112 and the first conductor 106 may be formed by the same process and in the same wiring layer 104. In one example, the power rail 116 and the second conductor 107 may be formed by depositing a dielectric layer over the substrate 102 (FIG. 1) (e.g., as part of the first wiring layer 104), etching the dielectric layer to form trenches therein, overfilling the trenches with electrically conductive metal-diffusion barrier layer and a metal conductor, and planarizing a top surface of the IC 100 to remove excessive barrier layer and metal conductor. The remaining metal conductor becomes the second conductor 107 and the power rail 116.

In one example, the metal plugs 114/108 and the conductors 112 and 106 are formed through a dual damascene process, which is briefly described below. First, a dielectric layer is deposited over the wiring layer 104 that contains the power rail 116 and the second conductor 107. Then, the dielectric layer is patterned by lithography processes and etching processes to form trenches therein. Lower portions of the trenches define via holes for the metal plugs 108 and 114, and upper portions of the trenches define a track trench for the first conductor 106 and the ASC 112. Subsequently, one or more electrically conductive metal-diffusion barrier layers are deposited on the sidewalls of the via holes and the track trench, and a metal conductor is deposited over the barrier layers. The barrier layers and the metal conductor overfill the trenches. A chemical mechanical planarization (CMP) process is subsequently performed to remove the excessive material and to planarize the top surface of the IC 100. The remaining metal conductor becomes the metal plugs 108 and 114, the first conductor 106, and the ASC 112.

FIGS. 3-11 illustrate various embodiments of the interconnect structure 105 with active atomic reservoir(s), constructed according to aspects of the present disclosure. These embodiments are non-limiting examples. Features and/or components described with respect to one embodiment may be combined with features and/or components described with respect to other embodiments of the present disclosure to form yet another embodiment of a device, system, or method according to the present disclosure even though such a combination is not explicitly shown. Further, any modifications to the described devices and any further application of the principles of the present disclosure are fully contemplated as would normally occur to one having ordinary skill in the art to which the disclosure relates.

Figure 3:
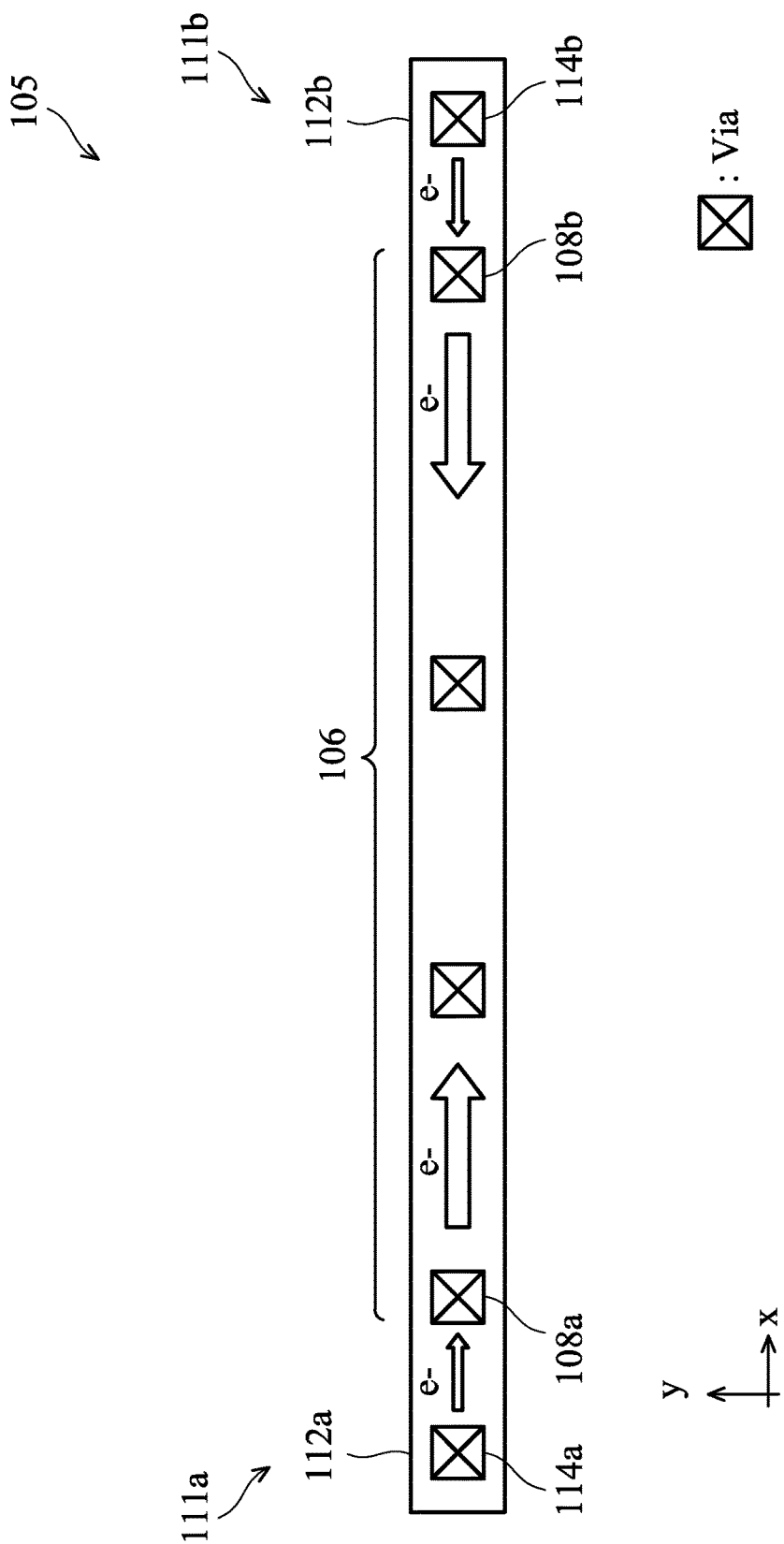
FIGS. 3, 4, 5, 6, 7, 8, 9, and 10 are top view of portions of the interconnect structure of the IC of FIG. 1, in accordance with some embodiments.

Referring to FIG. 3, shown therein is an embodiment of the interconnect structure 105, in portion and in a top view, with a first conductor 106 and two active atomic reservoirs 111a and 111b. The first conductor 106 is connected by two metal plugs 108a and 108b to other conductors or devices of the IC 100. The metal plugs 108a and 108b are disposed near two ends of the first conductor 106. Electrons flow from the metal plugs 108a and 108b to two other vias, respectively, along two segments of the first conductor 106. The metal plugs 108a and 108b, as well as their vicinity, are the concerns for electromigration. The active atomic reservoir 111a includes an ASC 112a and a metal plug 114a that connects the ASC 112a to a voltage source (not shown) of the IC 100. The active atomic reservoir 111b includes an ASC 112b and a metal plug 114b that connects the ASC 112b to another voltage source (not shown) of the IC 100. The voltage sources for the active atomic reservoirs 111a and 111b may be the same or different. The ASCs 112a and 112b are joined to the first conductor 106 at the two respective ends and extend along the longitudinal axis of the first conductor 106. The ASCs 112a and 112b have the same width as the first conductor 106. Other aspects of the interconnect structure 105 of FIG. 3 are the same as or similar to what have been described with respect to FIG. 2.

Figure 4:
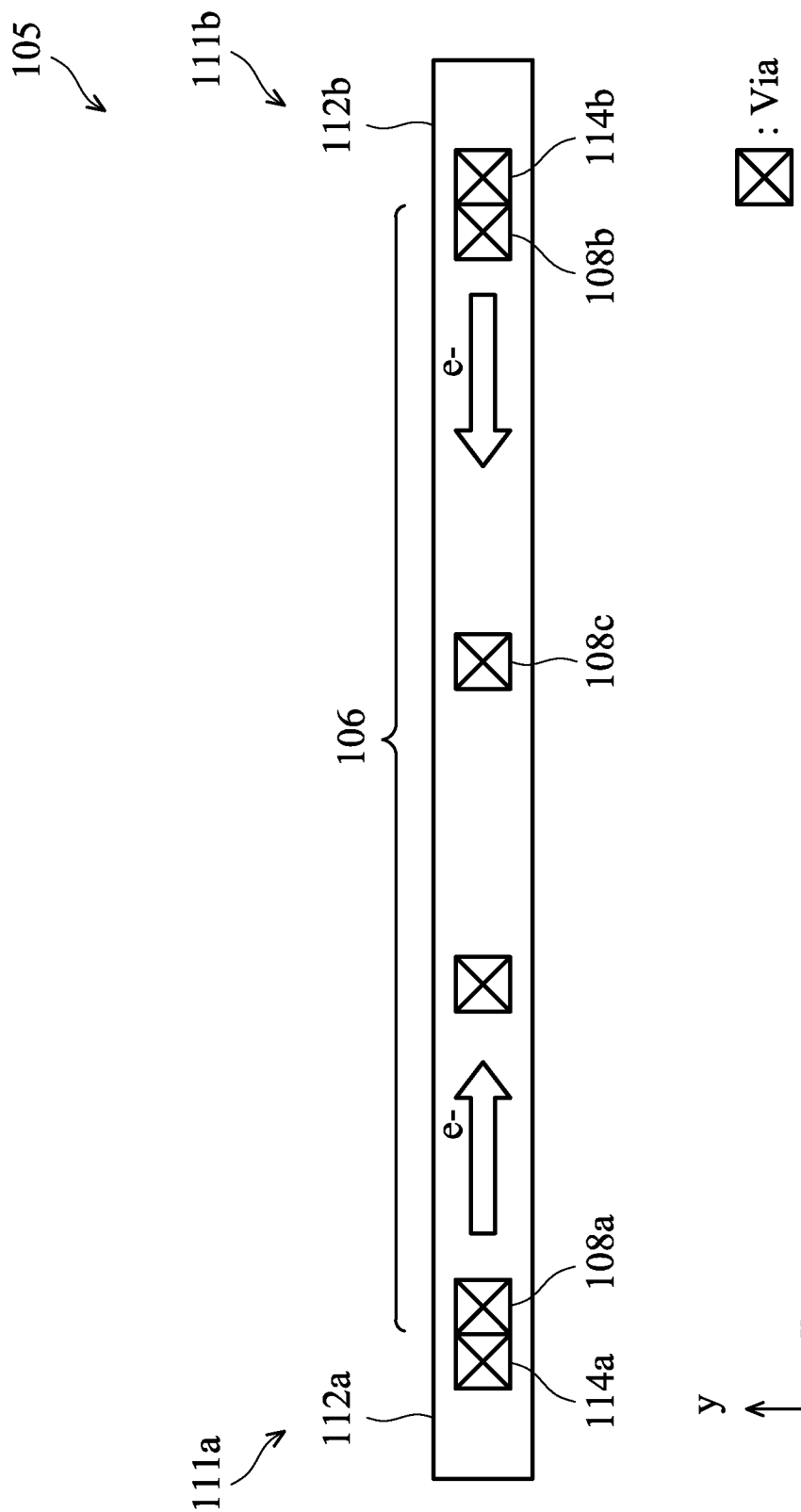

Referring to FIG. 4, shown therein is another embodiment of the interconnect structure 105, in portion and in a top view, with a first conductor 106 and two active atomic reservoirs 111a and 111b. The metal plugs 114a and 114b of the active atomic reservoirs 111a and 111b are joined to the metal plugs 108a and 108b, respectively, to form two rectangular metal plugs. In another word, the metal plugs 114a and 108a are disposed side-by-side and contacting each other, while the metal plugs 114b and 108b are disposed side-by-side and contacting each other. Studies have shown that rectangular metal plugs have higher electromigration reliability than square metal plugs. Other aspects of the interconnect structure 105 of FIG. 4 are the same as what have been described with respect to FIG. 3.

Figure 5:
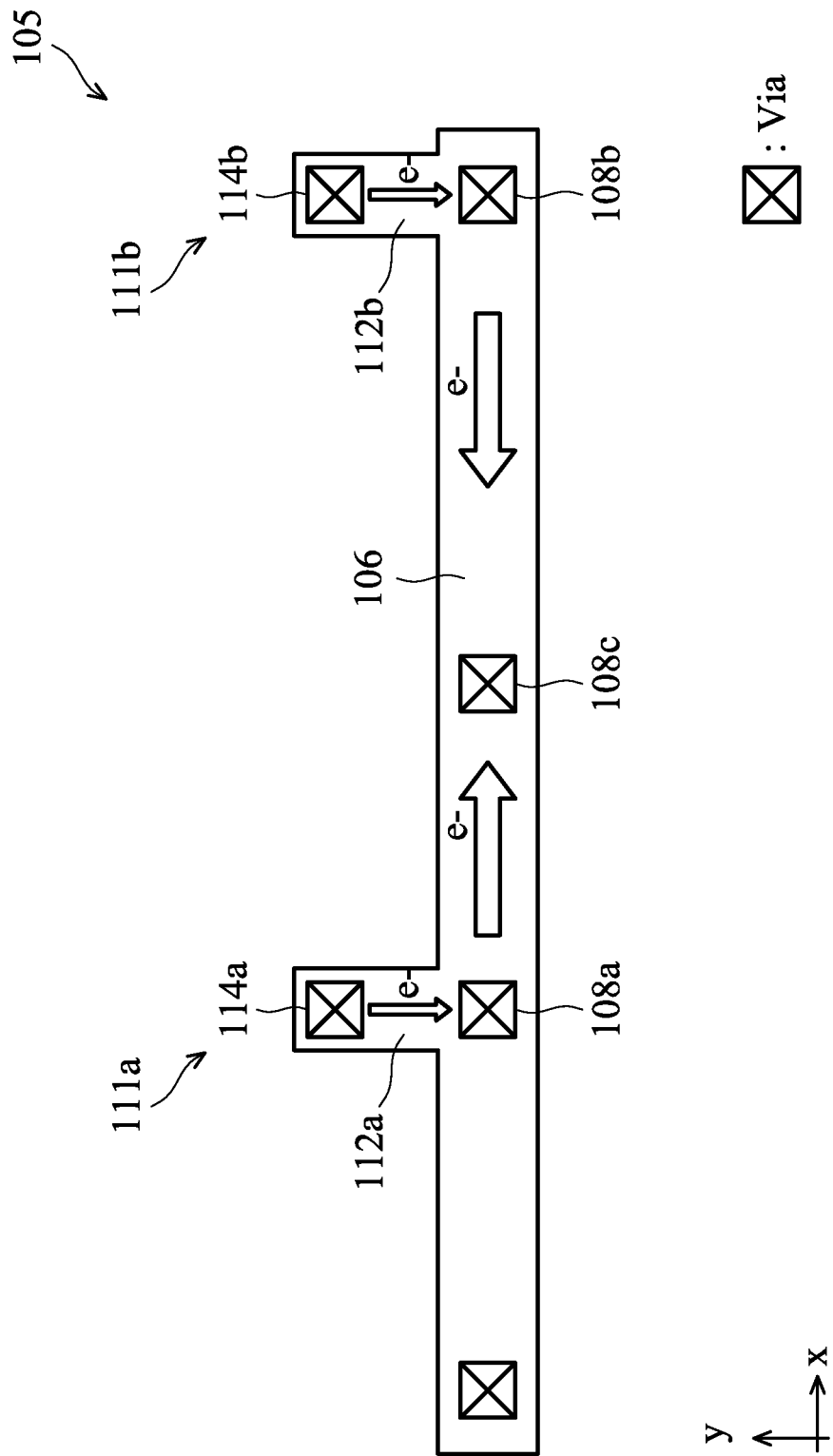

Referring to FIG. 5, shown therein is another embodiment of the interconnect structure 105, in portion and in a top view, with a first conductor 106 and two active atomic reservoirs 111a and 111b. The interconnect structure 105 includes three metal plugs 108a, 108b, and 108c that connect the first conductor 106 to one or more other conductors or devices of the IC 100. The metal plug 108c is disposed between the metal plugs 108a and 108b. By design and in the operational mode as shown, electrons flow from the metal plugs 108a and 108b to the metal plug 108c. The active atomic reservoirs 111a and 111b include ASCs 112a and 112b, respectively, in the same layer as the first conductor 106. The ASCs 112a and 112b are joined to the first conductor 106 proximate to the metal plugs 108a and 108b, respectively, and along a direction perpendicular to the longitudinal axis of the first conductor 106. In the embodiment as shown, the ASCs 112a and 112b are disposed on the same side of the first conductor 106. In an alternative embodiment, the ASCs 112a and 112b are disposed on the opposite sides of the first conductor 106. Other aspects of the interconnect structure 105 of FIG. 5 are the same as what have been described with respect to FIG. 3.

Figure 6:
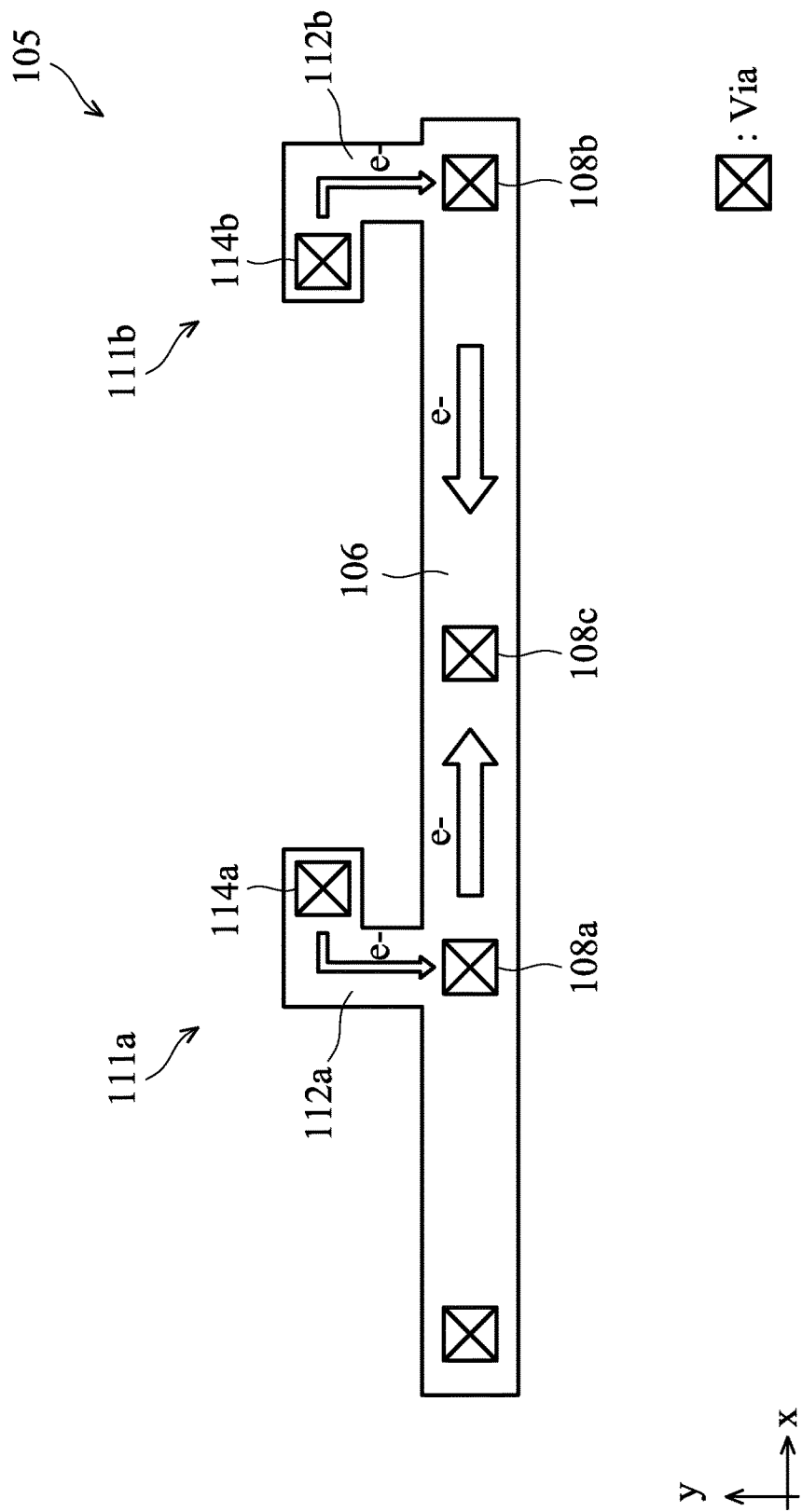

Referring to FIG. 6, shown therein is an embodiment of the interconnect structure 105, in portion and in a top view, with a first conductor 106 and two active atomic reservoirs 111a and 111b. The two active atomic reservoirs 111a and 111b include "L" shaped ASCs 112a and 112b, respectively. In each of the "L" shaped ASCs 112a and 112b, one segment of the ASC is parallel to the first conductor 106 and the other segment of the ASC is joined to the first conductor 106 to form a right angle. Other aspects of the interconnect structure 105 of FIG. 6 are the same as what have been described with respect to FIG. 5. Studies have shown that "L" shaped ASCs and straight line ASCs (e.g., in FIG. 5) have comparable electromigration lifetime performance. This enhances design flexibility when the widths and lengths of the ASCs are tuned for a particular interconnect structure.

Figure 7:
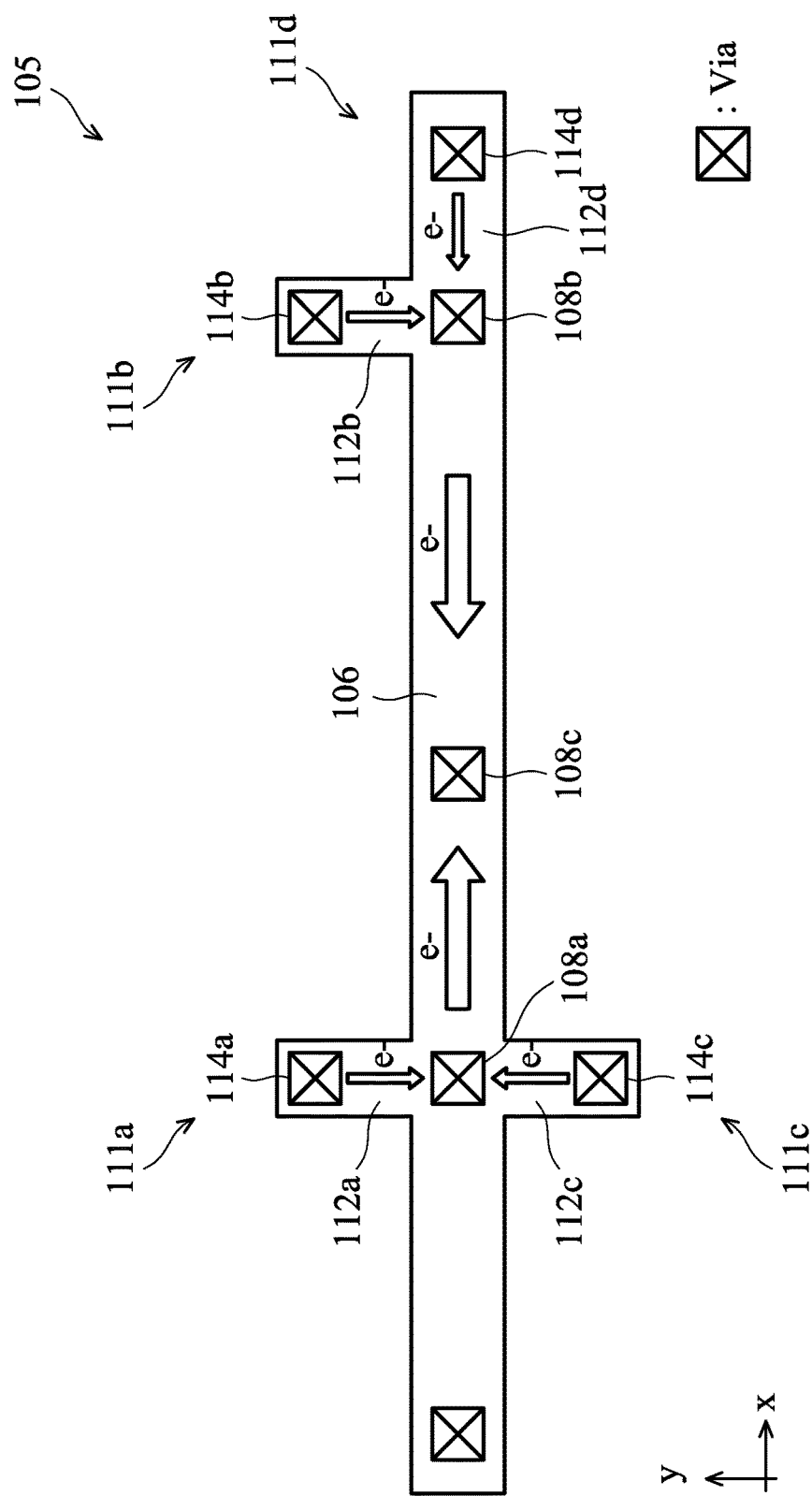

Referring to FIG. 7, shown therein is an embodiment of the interconnect structure 105, in portion and in a top view, with a first conductor 106 and four active atomic reservoirs 111a, 111b, 111c, and 111d. The interconnect structure 105 includes three metal plugs 108a, 108b, and 108c. The metal plug 108c is disposed between the metal plugs 108a and 108b. By design and in the operational mode as shown, electrons flow from the metal plugs 108a and 108b to the metal plug 108c. The active atomic reservoirs 111a-111d include ASCs 112a, 112b, 112c, and 112d, respectively. The ASCs 112a-112d are connected by metal plugs 114a, 114b, 114c, and 114d, respectively, to one or more voltage sources of the IC 100. The ASCs 112a and 112c are joined to the first conductor 106 proximate the metal plug 108a and on opposite sides of the first conductor 106. The ASCs 112a and 112c are oriented lengthwise along a direction perpendicular to the longitudinal axis of the first conductor 106. The ASCs 112a and 112c provide a stronger boost for the electromigration performance of the first conductor 106 than a single ASC 112a or 112c. The ASCs 112b and 112d are joined to the first conductor 106 proximate the metal plug 108b. The ASC 112b is oriented lengthwise along a direction perpendicular to the longitudinal axis of the first conductor 106. The ASC 112d is joined to an end of the first conductor 106 and extends along the longitudinal axis of the first conductor 106. The ASCs 112b and 112d provide a stronger boost for the electromigration performance of the first conductor 106 than a single ASC 112b or 112d.

Figure 8:
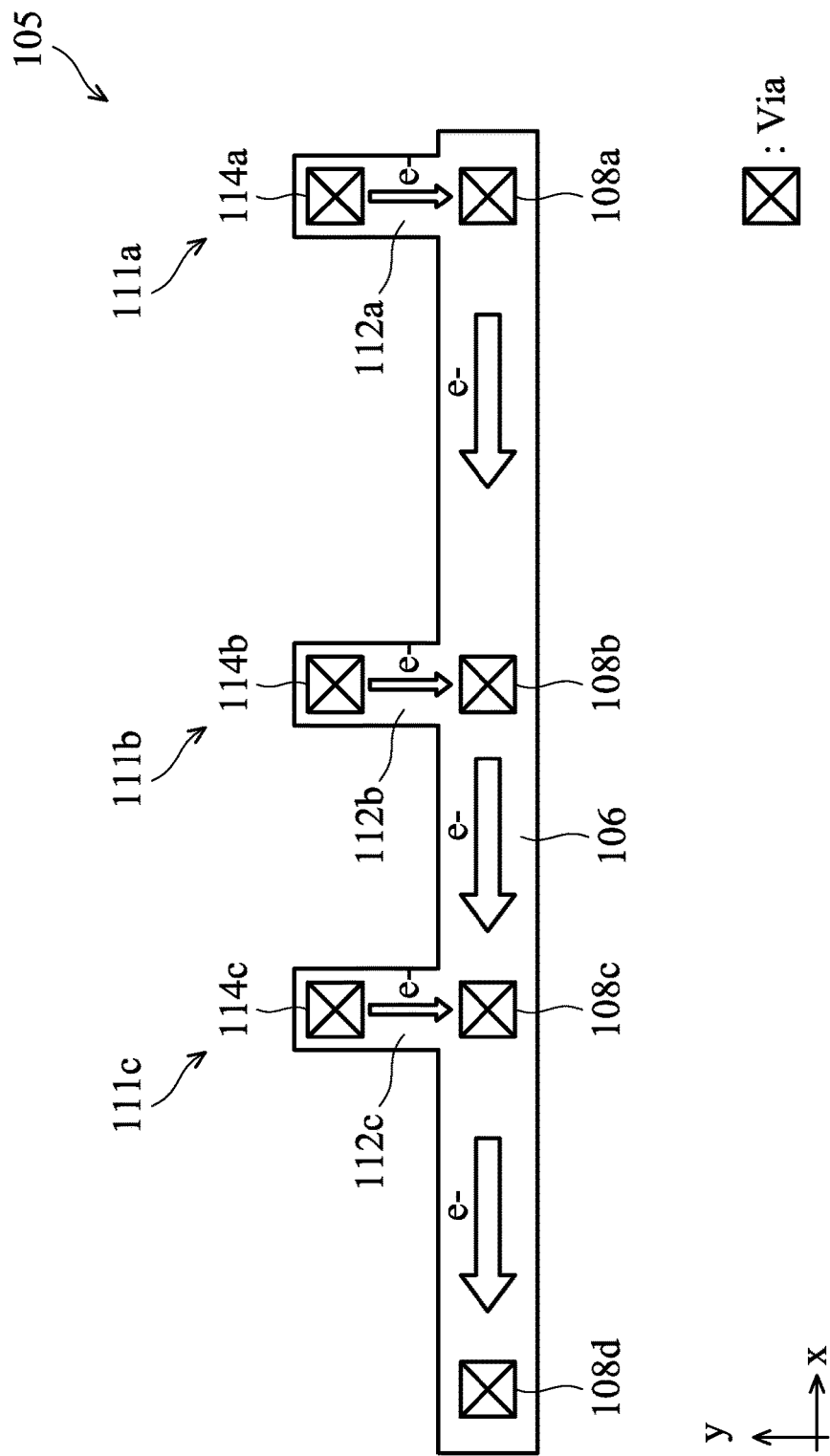

Referring to FIG. 8, shown therein is another embodiment of the interconnect structure 105, in portion and in a top view, with a first conductor 106 and three active atomic reservoirs 111a, 111b, and 111c. The interconnect structure 105 includes four metal plugs 108a, 108b, 108c, and 108d. The metal plugs 108a and 108d are disposed near two ends of the first conductor 106, and the metal plugs 108b and 108c are disposed in the middle portion of the first conductor 106. By design and in the operational mode as shown, electrons flow from the metal plugs 108a, 108b, and 108c to the metal plug 108d along three segments of the first conductor 106. The active atomic reservoirs 111a-111c include ASCs 112a, 112b, and 112c, respectively. Each of the ASCs 112a-112c is joined to the first conductor 106 along a respective direction perpendicular to the longitudinal axis of the first conductor 106. The ASCs 112a, 112b, and 112c may have the same dimension (width, length, shape) or different dimensions, depending on the needs of the electromigration performance of the three segments of the first conductor 106 to which the ASCs 112a-112c are joined.

Figure 9:
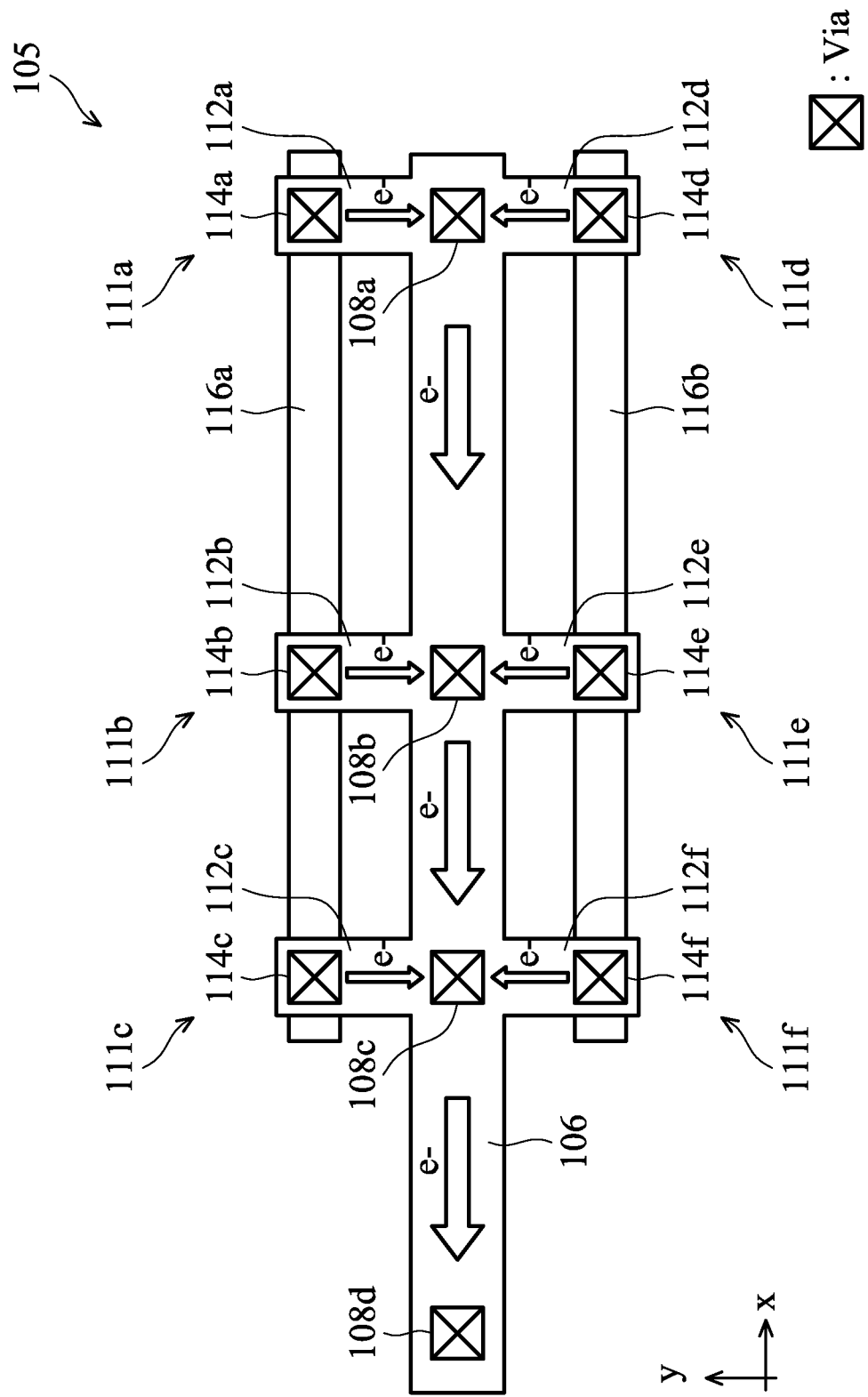

Referring to FIG. 9, shown therein is yet another embodiment of the interconnect structure 105, in portion and in a top view, with a first conductor 106 and six active atomic reservoirs 111a, 111b, 111c, 111d, 111e, and 111f. Similar to the embodiment in FIG. 8, the interconnect structure 105 of the present embodiment includes four metal plugs 108a, 108b, 108c, and 108d. The active atomic reservoirs 111a-111f include ASCs 112a, 112b, 112c, 112d, 112e, and 112f, respectively. The ASCs 112a, 112b, and 112c are connected by metal plugs 114a, 114b, and 114c, respectively, to a first power rail 116a. The ASCs 112d, 112e, and 112f are connected by metal plugs 114d, 114e, and 114f, respectively, to a second power rail 116b. The pair of ASCs, 112a and 112d, is joined to the first conductor 106 approximate to the metal plug 108a. The pair of ASCs, 112b and 112e, is joined to the first conductor 106 approximate to the metal plug 108b. The pair of ASCs, 112c and 112f, is joined to the first conductor 106 approximate to the metal plug 108c. The two power rails 116a and 116b may be disposed in the same wiring layer 104 or different wiring layers 104 (FIG. 1). Each pair of active atomic reservoirs (111a/111d, 111b/111e, and 111c/111f) boots the electromigration performance of the respective segment of the first conductor 106.

Figure 10:
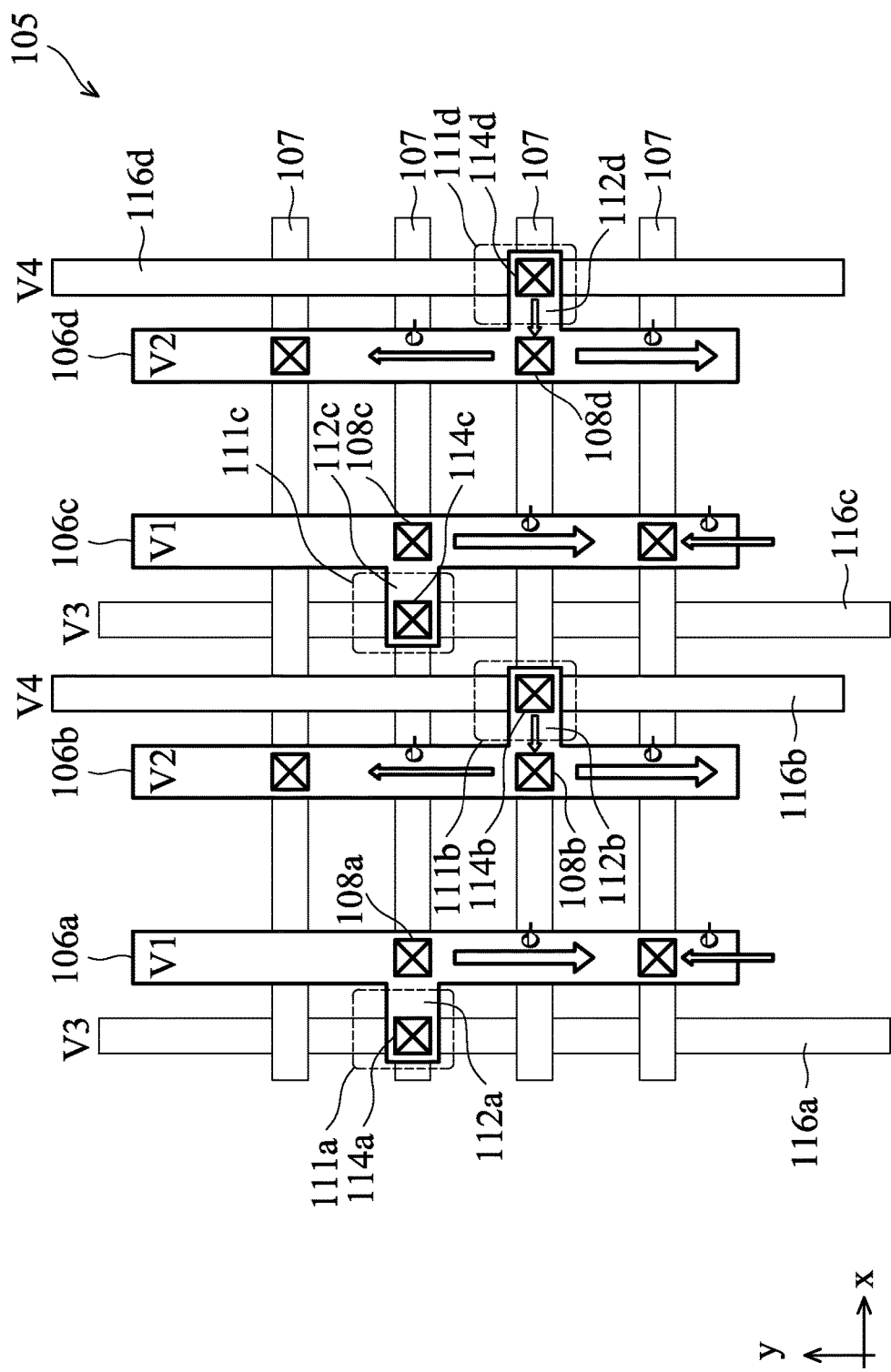

Referring to FIG. 10, shown therein is yet another embodiment of the interconnect structure 105, in portion and in a top view. The interconnect structure 105 includes four voltage sources labeled as V1, V2, V3, and V4. The interconnect structure 105 further includes conductors 106a, 106b, 106c, and 106d. The conductors 106a and 106c are connected (or biased) to the voltage source V1, making them power rails for the voltage source V1. Similarly, the conductors 106b and 106d are connected (or biased) to the voltage source V2, making them power rails for the voltage source V2. The interconnect structure 105 further includes conductors 116a, 116b, 116c, and 116d. The conductors 116a and 116c are power rails for the voltage source V3. The conductors 116b and 116d are power rails for the voltage source V4. The conductors 106a-106d and 116a-116d are oriented lengthwise along the "y" direction. In an embodiment, the conductors 106a-106d are disposed in the same wiring layer 104 (FIG. 1) (e.g., M2 layer), the conductors 116a and 116c are disposed in the same wiring layer 104 (e.g., M0 layer), and the conductors 116b and 116d are disposed in the same wiring layer 104 (e.g., M3 layer). In another embodiment, all or a portion of the conductors 106a-106d and 116a-116d are disposed in the same wiring layer 104.

The interconnect structure 105 further includes conductors 107 oriented lengthwise along the "x" direction in a wiring layer 104 different from where the conductors 106a-106d and 116a-116d are disposed. The interconnect structure 105 further includes metal plugs 108a, 108b, 108c, and 108d that connect the conductors 106a-106d, respectively, to one or more of the conductors 107.

The interconnect structure 105 further includes active atomic reservoirs 111a, 111b, 111c, and 111d. The active atomic reservoirs 111a-111d include ASCs 112a, 112b, 112c, and 112d, respectively, in the same wiring layer 104 as the conductors 106a-106d. The ASCs 112a-112d are oriented lengthwise along the "x" direction, and are joined to the conductors 106a-106d proximate the metal plugs 108a-108d, respectively. The active atomic reservoirs 111a-111d further include metal plugs 114a, 114b, 114c, and 114d. The metal plugs 114a-114d connect the ASCs 112a-112d to the power rails 116a-116d respectively. The active atomic reservoirs 111a-111d are integrated with other parts of the interconnect structure 105 to form a mesh structure.

Figure 11:
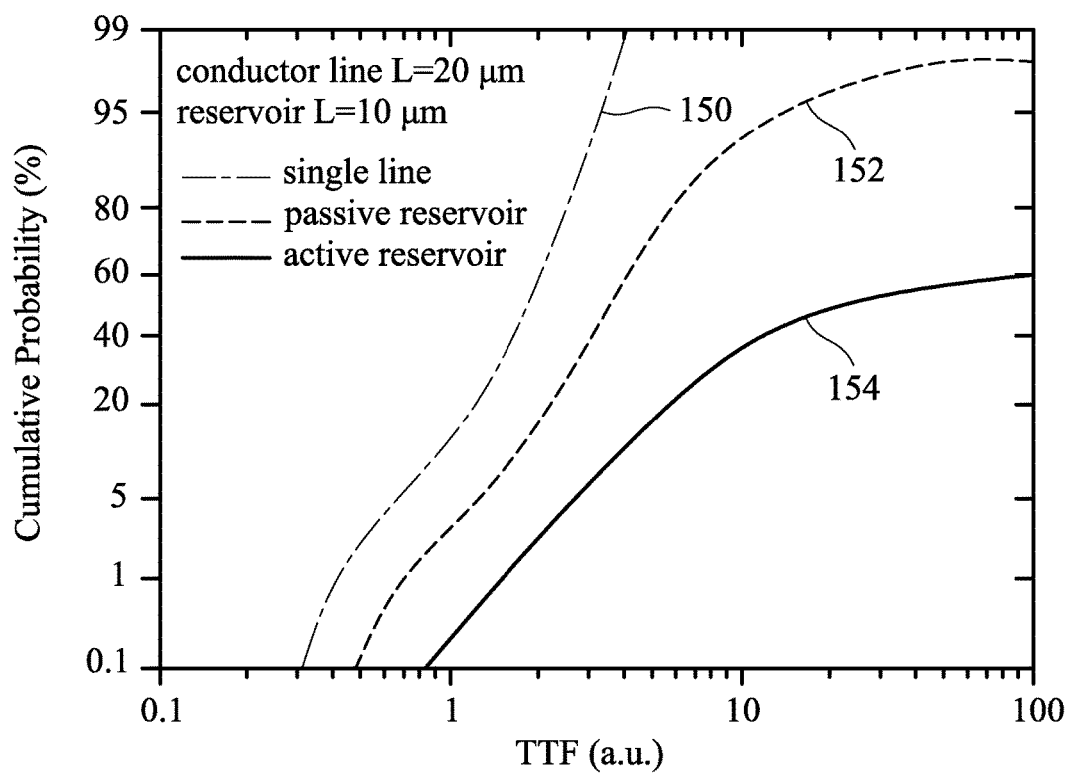
FIG. 11 is a graph showing improvements in electromigration reliability with an embodiment of the present disclosure.

FIG. 11 illustrates some benefits of an embodiment of active atomic reservoir, constructed according to aspects of the present disclosure. Referring to FIG. 11, the graphs 150, 152, and 154 illustrate electromigration performance of three conductors through simulations. The horizontal axis is the normalized time-to-failure, and the vertical axis is the cumulative probability of failure due to electromigration. The three conductors have the same length (L=20 μm) and the same width, and comprise the same material. The first conductor, associated with the graph 150, does not have either passive or active atomic reservoir (e.g., the conductor 106 in FIG. 3). It serves as the reference point for the comparison. The second conductor, associated with the graph 152, is joined by a passive atomic reservoir with a length of 10 μm (such as the conductor 112a of FIG. 3 with the metal plug 114a, but without voltage biasing). The third conductor, associated with the graph 154, is joined by an active atomic reservoir (e.g., the active atomic reservoir 111a in FIG. 3) where a length of the ASC is 10 μm. As shown in FIG. 11, the active atomic reservoir provides a much better boost to the electromigration performance of the conductor than the passive atomic reservoir.

Although not intended to be limiting, one or more embodiments of the present disclosure provide many benefits to a semiconductor device and the formation thereof. For example, embodiments of the present disclosure provide active atomic reservoirs in various configurations. The parameters of the active atomic reservoirs can be tuned for particular needs of an integrated circuit (IC) based on the target IC product lifetime and the target current density. For example, the dimensions (such as width, length, and shape) of the atomic source conductors, the spacing between metal plugs of the active atomic reservoir and the target conductor, the voltage biasing applied to the active atomic reservoirs, as well as the number of active atomic reservoirs assigned to a target conductor can all be tuned based on design needs.

In one exemplary aspect, the present disclosure is directed to an integrated circuit (IC). The IC comprises a first conductor in one layer of the IC, a second conductor in another layer of the IC, and a first metal plug connecting the first and second conductors. The IC further comprises an atomic source conductor (ASC) in the one layer of the IC and joined to the first conductor, and a second metal plug connecting the ASC to a voltage source of the IC. The first conductor and the ASC are configured to be biased to different voltages so as to establish an electron path from the second metal plug to the first metal plug such that the ASC acts as an active atomic source for the first conductor.

In another exemplary aspect, the present disclosure is directed to an integrated circuit (IC). The IC comprises a first conductor in one layer of the IC, and first, second, and third metal plugs connecting the first conductor to one or more other conductors of the IC. The IC further comprises a first atomic source conductor (ASC) in the one layer of the IC and joined to the first conductor proximate the first metal plug, and a fourth metal plug connecting the first ASC to a voltage source of the IC. The IC further comprises a second ASC in the one layer of the IC and joined to the first conductor proximate the second metal plug, and a fifth metal plug connecting the second ASC to the voltage source of the IC. The first conductor and the first and second ASCs are configured to be biased to different voltages so as to establish electron paths from the fourth metal plug to the first metal plug and from the fifth metal plug to the second metal plug such that the first and second ASCs act as active atomic sources for the first conductor.

In another exemplary aspect, the present disclosure is directed to an integrated circuit (IC). The IC comprises first and second conductors in one layer of the IC, wherein the first and second conductors are configured to be biased to first and second voltage sources of the IC respectively. The IC further comprises first and second metal plugs connecting the first and second conductors, respectively, to other conductors of the IC. The IC further comprises a first atomic source conductor (ASC) in the one layer of the IC and joined to the first conductor proximate the first metal plug, and a second ASC in the one layer of the IC and joined to the second conductor proximate the second metal plug. The IC further comprises third and fourth metal plugs connecting the first and second ASCs to power rails of third and fourth voltage sources of the IC respectively. The first and third voltage sources are so configured as to establish an electron path from the third metal plug to the first metal plug such that the first ASC acts as an active atomic source for the first conductor. The second and fourth voltage sources are so configured as to establish an electron path from the fourth metal plug to the second metal plug such that the second ASC acts as an active atomic source for the second conductor.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
    a first conductor in one layer of the IC;
    a second conductor in another layer of the IC;
    a first metal plug connecting the first and second conductors;
    an atomic source conductor (ASC) in the one layer of the IC and joined to the first conductor; and
    a second metal plug connecting the ASC to a voltage source of the IC,
    wherein the first conductor and the ASC are configured to be biased to different voltages so as to establish an electron path from the second metal plug to the first metal plug such that the ASC acts as an active atomic source for the first conductor.

2. The IC of claim 1, wherein the ASC is joined to an end of the first conductor and extends along a longitudinal axis of the first conductor.

3. The IC of claim 2, wherein the ASC and the first conductor have the same width.

4. The IC of claim 1, wherein the ASC is joined to the first conductor along a direction perpendicular to a longitudinal axis of the first conductor.

5. The IC of claim 4, wherein the ASC is joined to the first conductor proximate the first metal plug.

6. The IC of claim 1, wherein a length of the ASC is in a range of 0.02 microns to 2 microns.

7. The IC of claim 1, further comprising:
    another ASC in the one layer of the IC and joined to the first conductor; and a third metal plug connecting the another ASC to the voltage source of the IC, wherein the another ASC acts as another active atomic source for the first conductor.

8. The IC of claim 7, wherein the ASC and the another ASC are joined to the first conductor proximate the first metal plug and on opposite sides of the first conductor.

9. The IC of claim 7, wherein:
the ASC is joined to an end of the first conductor and extends along a longitudinal axis of the first conductor; and
the another ASC is joined to the first conductor along a direction perpendicular to a longitudinal axis of the first conductor.

10. The IC of claim 1, wherein the different voltages are configured such that the electron path is always from the second metal plug to the first metal plug while the IC is in operation.

11. The IC of claim 1, wherein the first and second metal plugs are disposed side-by-side and contacting each other.

12. An integrated circuit (IC), comprising:
a first conductor in one layer of the IC;
first, second, and third metal plugs connecting the first conductor to one or more other conductors of the IC;
a first atomic source conductor (ASC) in the one layer of the IC and joined to the first conductor proximate the first metal plug;
a fourth metal plug connecting the first ASC to a voltage source of the IC;
a second ASC in the one layer of the IC and joined to the first conductor proximate the second metal plug; and
a fifth metal plug connecting the second ASC to the voltage source of the IC,
wherein the first conductor and the first and second ASCs are configured to be biased to different voltages so as to establish electron paths from the fourth metal plug to the first metal plug and from the fifth metal plug to the second metal plug such that the first and second ASCs act as active atomic sources for the first conductor.

13. The IC of claim 12, wherein the third metal plug is disposed between the first and second metal plugs.

14. The IC of claim 12, wherein the first and second ASCs are disposed on opposite sides of the first conductor.

15. The IC of claim 12, wherein the first and second ASCs are disposed on same side of the first conductor.

16. The IC of claim 12, wherein:
the first metal plug is disposed near an end of the first conductor;
the first ASC is joined to the end of the first conductor and disposed along a longitudinal axis of the first conductor; and
the second ASC is disposed along a direction perpendicular to the longitudinal axis of the first conductor.

17. The IC of claim 12, wherein the first and fourth metal plugs are disposed side-by-side and contacting each other, and wherein the second and fifth metal plugs are disposed side-by-side and contacting each other.

18. An integrated circuit (IC), comprising:
first and second conductors in one layer of the IC, wherein the first and second conductors are configured to be biased to first and second voltage sources of the IC respectively;
first and second metal plugs connecting the first and second conductors, respectively, to other conductors of the IC;
a first atomic source conductor (ASC) in the one layer of the IC and joined to the first conductor proximate the first metal plug;
a second ASC in the one layer of the IC and joined to the second conductor proximate the second metal plug; and
third and fourth metal plugs connecting the first and second ASCs to power rails of third and fourth voltage sources of the IC respectively,
wherein the first and third voltage sources are so configured as to establish an electron path from the third metal plug to the first metal plug such that the first ASC acts as an active atomic source for the first conductor, and
wherein the second and fourth voltage sources are so configured as to establish an electron path from the fourth metal plug to the second metal plug such that the second ASC acts as an active atomic source for the second conductor.

19. The IC of claim 18, wherein the power rails of the third and fourth voltage sources are disposed in different layers of the IC, each of which is different from the one layer.

20. The IC of claim 18, wherein the first and second conductors are oriented lengthwise along a first direction, and wherein the first and second ASCs are oriented lengthwise along a second direction that is perpendicular to the first direction.

* * * * *